United States Patent
Yang et al.

(10) Patent No.: US 11,127,464 B2
(45) Date of Patent: Sep. 21, 2021

(54) METHOD OF PROGRAMMING 3D MEMORY DEVICE AND RELATED 3D MEMORY DEVICE

(71) Applicant: Yangtze Memory Technologies Co., Ltd., Wuhan (CN)

(72) Inventors: Xue Peng Yang, Wuhan (CN); Kaikai You, Wuhan (CN)

(73) Assignee: Yangtze Memory Technologies Co., Ltd., Wuhan (CN)

(*) Notice: Subject to any disclaimer, the term of this patent is extended or adjusted under 35 U.S.C. 154(b) by 0 days.

(21) Appl. No.: 16/827,682

(22) Filed: Mar. 23, 2020

(65) Prior Publication Data

US 2021/0249082 A1    Aug. 12, 2021

Related U.S. Application Data

(63) Continuation of application No. PCT/CN2020/074401, filed on Feb. 6, 2020.

(51) Int. Cl.
| | |
|---|---|
| *G11C 16/10* | (2006.01) |
| *G11C 16/04* | (2006.01) |
| *G11C 16/24* | (2006.01) |
| *H01L 27/11582* | (2017.01) |
| *G11C 11/56* | (2006.01) |
| *H01L 27/11556* | (2017.01) |

(52) U.S. Cl.
CPC .......... *G11C 16/10* (2013.01); *G11C 16/0483* (2013.01); *G11C 16/24* (2013.01); *G11C 11/5628* (2013.01); *G11C 11/5671* (2013.01); *H01L 27/11556* (2013.01); *H01L 27/11582* (2013.01)

(58) Field of Classification Search
CPC ......... G11C 16/10; G11C 16/24; G11C 16/12; G11C 16/0483; G11C 11/5671; G11C 11/5628; H01L 27/11582; H01L 27/11556
See application file for complete search history.

(56) References Cited

U.S. PATENT DOCUMENTS

| | | | |
|---|---|---|---|
| 9,767,906 B2* | 9/2017 | Ahn ........................ | G11C 5/025 |
| 2020/0168276 A1* | 5/2020 | Yang ..................... | G11C 16/045 |

FOREIGN PATENT DOCUMENTS

| | | |
|---|---|---|
| CN | 101617370 A | 12/2009 |
| CN | 108962912 A | 12/2018 |
| CN | 109119117 A | 1/2019 |
| CN | 110021331 A | 7/2019 |

* cited by examiner

*Primary Examiner* — David Lam
(74) *Attorney, Agent, or Firm* — Winston Hsu (57) ABSTRACT

In a channel-stacked memory device which includes a first channel stacked on a second channel, the first channel is programmed in a bottom-to-top direction and the second channel is programmed in a top-to-bottom direction. The electrons in the first channel may be drained by a bit line, while the electrons in the second channel may be drained by a well region.

18 Claims, 7 Drawing Sheets

METHOD OF PROGRAMMING 3D MEMORY DEVICE AND RELATED 3D MEMORY DEVICE

CROSS REFERENCE TO RELATED APPLICATIONS

This application is a continuation of PCT Application No. PCT/CN2020/074401 filed on Feb. 6, 2020, the entire contents of which are incorporated herein by reference.

BACKGROUND OF THE INVENTION

1. Field of the Invention

The present invention is related a method of programming a 3D memory device and a related 3D memory device, and more particularly, to a method of programming a channel-stacked 3D memory device and a related channel-stacked 3D memory device.

2. Description of the Prior Art

Semiconductor memory has become more popular for use in various electronic devices. For example, non-volatile semiconductor memory is applied in cellular telephones, digital cameras, personal digital assistants, mobile computing devices, non-mobile computing devices and other devices. Recently, ultra high density storage devices have been proposed using a three-dimensional (3D) stacked memory structure sometimes referred to as a Bit Cost Scalable (BiCS) architecture. For example, a 3D NAND stacked flash memory device can be formed from an array of alternating conductive and dielectric layers. A memory hole is drilled in the layers to define many memory layers simultaneously. A NAND string is then formed by filling the memory hole with appropriate materials. Control gates of the memory cells are provided by the conductive layers.

A single-level cell (SLC) non-volatile memory can only store only one bit per memory element, while a multi-level cell (MLC) non-volatile memory can store more than one bit per cell. For example, a NAND memory having 16 voltage levels per cell may be referred to as quad-level cell (QLC) memory and may represent 4 bits of data per cell.

In order to maximize memory density, a channel-stacked 3D memory device may be fabricated by vertically stacking multiple conventional planar memory arrays, wherein a middle dummy layer is introduced between two adjacent planar memory arrays. In a prior art method of programming a channel-stacked 3D memory device, the cells are programed in a direction from bottom to top with the middle dummy layer biased at a specific voltage level, thereby allowing the electrons to be drained by the bit line. In order to increase the boosting voltage of unselected memory strings, bit line pre-charge or well region pre-charge may be performed before programming the cells. However, due to the variations in the threshold voltages between different cells, it is difficult to decide an appropriate pre-charge voltage for the well region.

SUMMARY OF THE INVENTION

The present invention provides a method of programming a channel-stacked memory device which includes a first group of cells in a first channel stacked on a second group of cells in a second channel. The method includes programming the first group of cells in the first channel in a bottom-to-top direction and programming the second group of cells in the second channel in a top-to-bottom direction.

The present invention also provides a memory device which includes a plurality of cells formed in a substrate, a plurality of bit lines formed in the substrate, a memory string, and a control unit. The memory string includes a first channel controlled by a selected bit line among the plurality of bit lines, a first group of cells among the plurality of cells, and a top dummy layer formed in the substrate, and a second channel controlled by the selected bit line, a second group of cells among the plurality of cells, and a bottom dummy layer formed in the substrate, wherein the first channel is stacked on the second channel. The control unit is configured to program the first channel in a bottom-to-top direction and program the second channel in a top-to-bottom direction.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
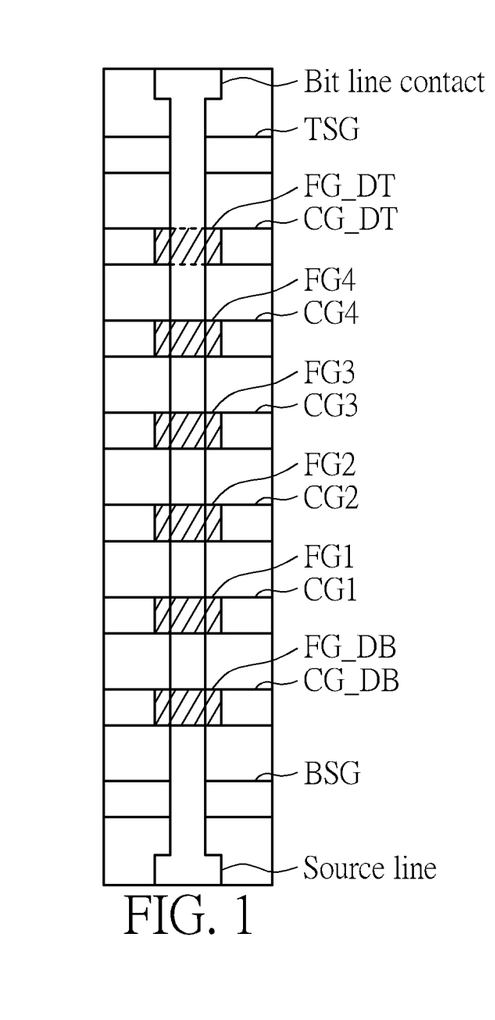
FIG. 1 is a top-view diagram illustrating one planar NAND string associated with a channel-stacked 3D memory device according to an embodiment of the present invention.
Figure 2:
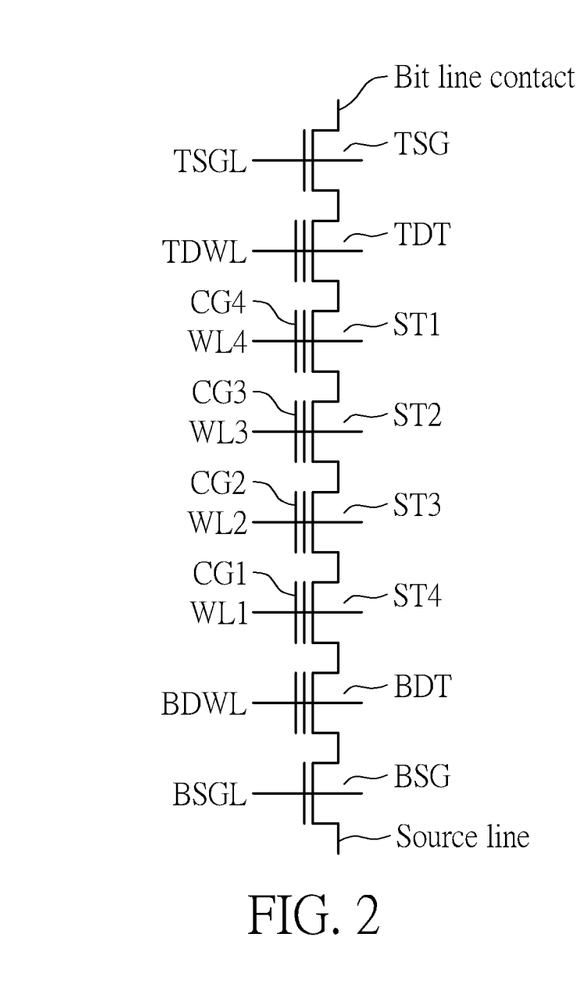
FIG. 2 is a diagram illustrating an equivalent circuit of one planar NAND string associated with a channel-stacked 3D memory device according to an embodiment of the present invention.

FIG. 1 is a top-view diagram illustrating one planar NAND string associated with a channel-stacked 3D memory device according to an embodiment of the present invention. FIG. 2 is a diagram illustrating an equivalent circuit thereof. In a flash memory system using the NAND structure, multiple transistors are arranged in series and sandwiched between two select gates, which are referred to as a NAND string. The planar NAND string depicted in FIGS. 1 and 2 includes a top dummy transistor TDT, four storage transistors ST1~ST4 and a bottom dummy transistor BDT coupled in series and sandwiched between a top select gate TSG (on the drain side) and a bottom select gate SG_B (on the source side). The top select gate TSG is arranged for connecting the planar NAND string to a bit line via a bit line contact and may be controlled by applying appropriate voltages to a top select gate line SGTL. The bottom select gate BSG is arranged for connecting the planar NAND string to a source line and may be controlled by applying appropriate voltages to a bottom select gate line BSGL. Each of the top dummy transistor TDT, the bottom dummy transistor BDT and the storage transistors ST1~ST4 includes a control gate and a floating gate. For example, the storage transistor ST1 includes a control gate CG1 and a floating gate FG1, the storage transistor ST2 includes a control gate CG2 and a floating gate FG2, the storage transistor ST3 includes a control gate CG3 and a floating gate FG3, the storage transistor ST4 includes a control gate CG4 and a floating gate FG4, the top dummy transistor TDT includes a control gate CG_DT and a floating gate FG_DT, and the bottom dummy transistor BDT includes a control gate CG DB and a floating gate FG_DB. The control gate CG1 is connected to a word line WL1, the control gate CG2 is connected to a word line WL2, the control gate CG3 is connected to a word line WL3, the control gate CG4 is connected to a word line WL4, the control gate CG_DT is connected to a top dummy word line TDWL, and the control gate CG DB is connected to a bottom dummy word line BDWL.

For illustrative purpose, FIGS. 1 and 2 show four memory cells for read/write operation (the storage transistors ST1~ST4) and two dummy cells for read/write test (the top dummy transistor TDT and the bottom dummy transistor BDT) in the planar NAND string. In other embodiments, a planar NAND string may include 8 memory cells, 16 memory cells, 32 memory cells, 64 memory cells, 128 memory cells, etc. However, the number of memory cells or dummy cells in a planar NAND string does not limit the scope of the present invention.

A typical architecture for a planar flash memory system using a NAND structure includes several planar NAND strings. Each planar NAND string is connected to the source line by its bottom select gate BSG controlled by the select line SGBL and connected to its associated bit line by its top select gate TSG controlled by the select line SGTL. Each bit line and the respective planar NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

Figure 3:
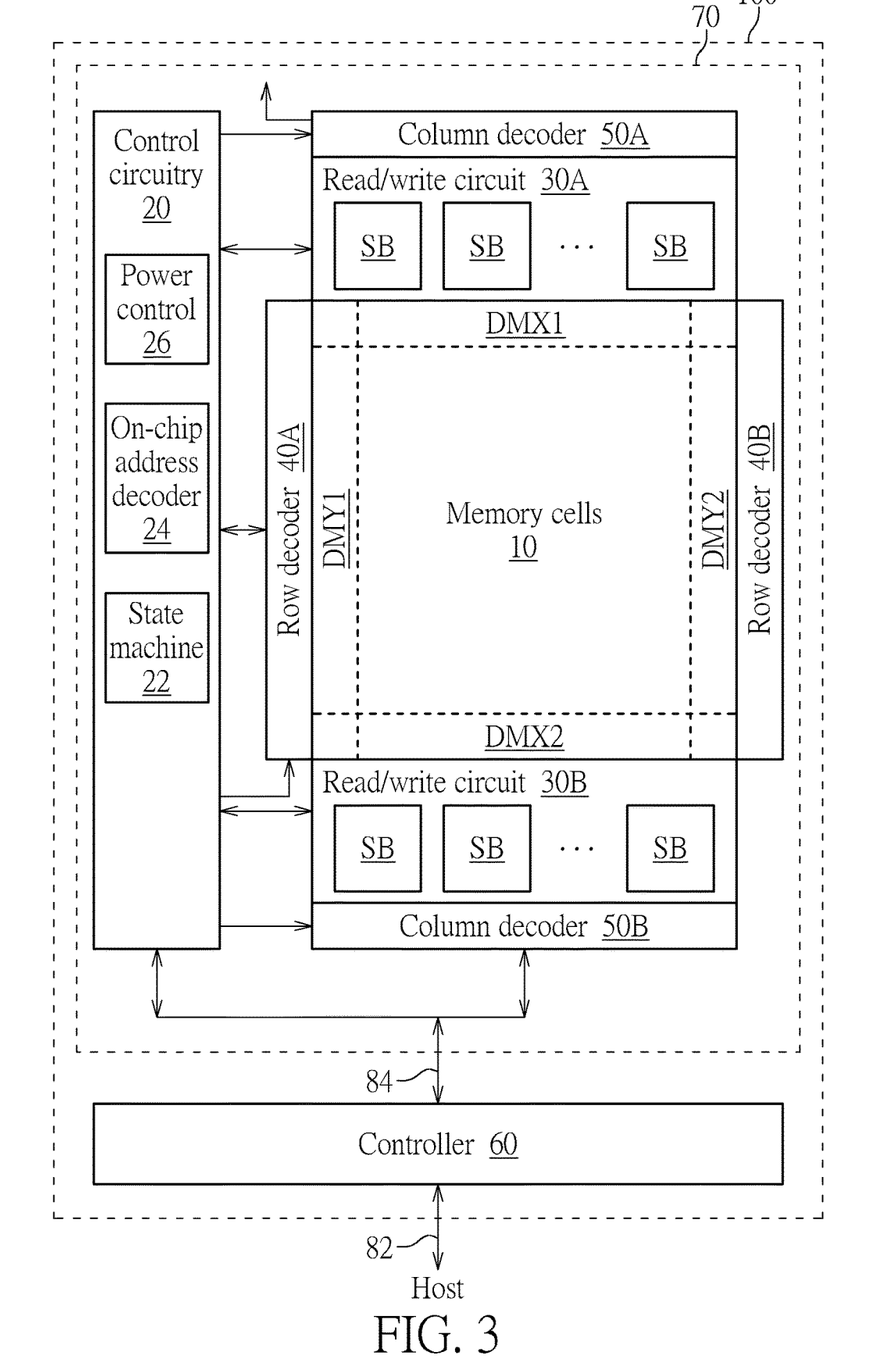
FIG. 3 is a diagram illustrating a 3D memory device having read/write circuits for reading and programming memory cells in parallel according to an embodiment of the present invention.

FIG. 3 is a diagram illustrating a planar memory device 100 having read/write circuits for reading and programming a page (or other unit) of memory cells in parallel according to an embodiment of the present invention. The planar memory device 100 includes an array (two-dimensional or three dimensional) of memory cells 10, a control circuitry 20, read/write circuits 30A and 30B, row decoders 40A and 40B, column decoders 50A and 50B, and a controller 60. In one embodiment, access to the memory array 10 by the various peripheral circuits is implemented in a symmetric fashion, on opposite sides of the array, so that the densities of access lines and circuitry on each side are reduced by half. The read/write circuits 30A and 30B include multiple sense blocks SB which allow a page of memory cells to be read or programmed in parallel. The array of memory cells 10 is addressable by word lines via the row decoders 40A and 40B and by bit lines via the column decoders 50A and 50B. In a typical embodiment, the memory cells 10, the control circuitry 20, the read/write circuits 30A and 30B, the row decoders 40A and 40B, and the column decoders 50A and 50B may be fabricated on a memory chip 70. Commands and data are transferred between a host and the controller 60 via a signal line 82 and between the controller 60 and the memory chip 70 via a signal line 84. A plurality of dummy cells, dummy word lines and dummy bit lines (not shown) may be laid in dummy storage areas DMX1-DMX2 and DMY1-DMY2 typically located along the sides of the memory array 10 for running read/write tests after the completion of the memory device 100.

The control circuitry 20 is configured to cooperate with the read/write circuits 30A and 30B for performing memory operations on the array of memory cells 10. The control circuitry 20 includes a state machine 22, an on-chip address decoder 24 and a power control module 26. The state machine 22 is configured to provide chip-level control of memory operations. The on-chip address decoder 24 is configured to provide an address interface between that used by the host or a memory controller to the hardware address used by the row decoders 40A, 40B and the column decoders 50A, 50B. The power control module 26 is configured to control the power and voltages supplied to the word lines and bit lines during each memory operation.

Figure 4:
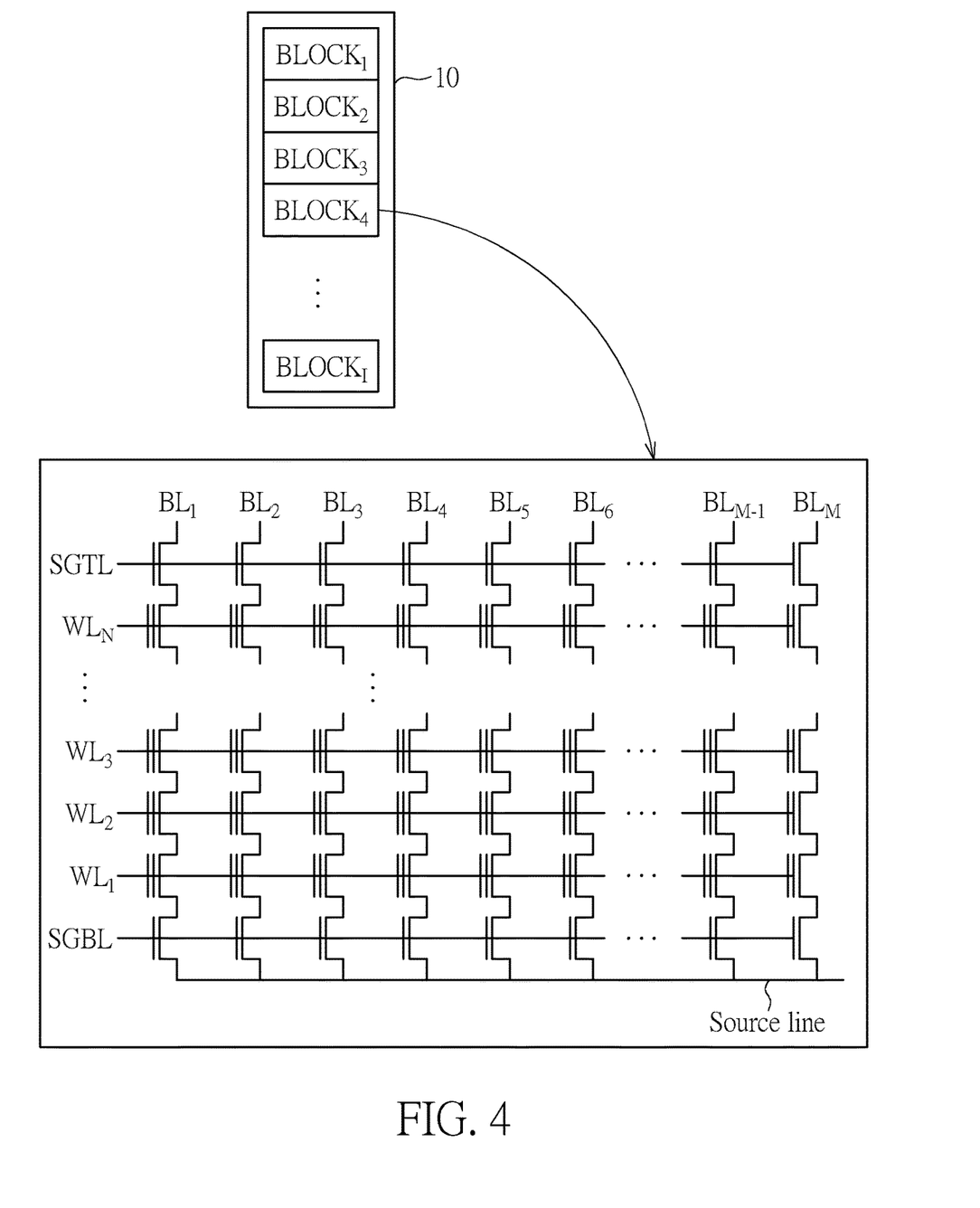
FIG. 4 is a diagram illustrating an exemplary structure of an array of memory cells in a planar configuration according to an embodiment of the present invention.

FIG. 4 is a diagram illustrating an exemplary structure of the array of memory cells 10 in a planar configuration according to an embodiment of the present invention. The array of memory cells 10 is divided into multiple blocks of memory cells denoted by $BLOCK_1$~$BLOCK_I$, wherein I is a positive integer and typically equal to a large number. A block contains a set of NAND strings which are accessed via bit lines $BL_1$-$BL_M$ and a common set of word lines $WL_1$~$WL_N$, wherein M and N are integers larger than 1. One terminal of the NAND string is connected to a corresponding bit line via the top select gate (controlled by the top select gate line TSGL), and another terminal is connected to the source line via the bottom select gate (controlled by the bottom select gate line BSGL). Each block is typically divided into a number of pages. In one embodiment, a block is the unit of conventional erase and a page is the unit of conventional programming. However, other units of erase/program can also be used.

In an embodiment, the array of memory cells 10 includes a triple well comprising a p-type substrate, an n-well within the p-type substrate, and a p-well within the n-well. The channel regions, source regions and drain regions are typically positioned in the p-well. The p-well and n-well are considered part of the p-type substrate, wherein the entire array of memory cells 10 is within one p-well, with trenches in the p-well providing electrical isolation between NAND strings. In another embodiment, the array of memory cells 10 includes a triple well comprising an n-type substrate, a p-well within the n-type substrate, and an n-well within the p-well. The p-well and n-well are considered part of the n-type substrate, wherein the channel regions, the source regions and the drain regions are typically positioned in the n-well. However, the implementation of the memory cells in a NAND string does not limit the scope of the present invention.

Figure 5:
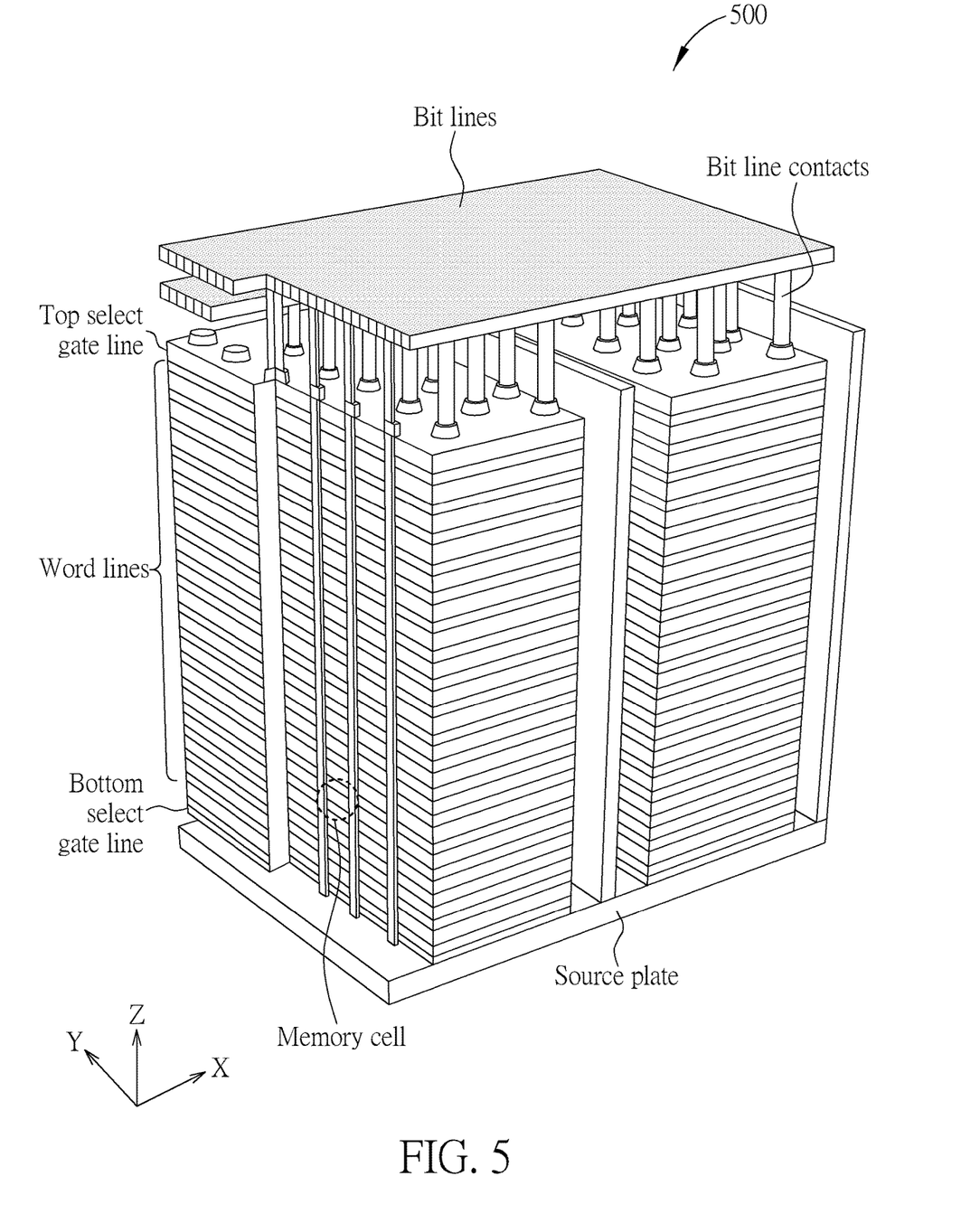
FIG. 5 is a diagram illustrating an exemplary structure of a channel-stacked memory device according to an embodiment of the present invention.

FIG. 5 is a diagram illustrating an exemplary structure of a channel-stacked memory device 500 according to an embodiment of the present invention. The channel-stacked memory device 500 can, loosely speaking, be formed by tilting up a plurality of the array of memory cells 10 in FIG. 4 to be perpendicular to the x-y plane. In this example, each y-z plane corresponds to the page structure of FIG. 4, with multiple such planes at differing locations along the x-axis. Each of the global bit lines runs across the top to an associated sense amplifier (not shown). The word lines, source plates and select gate lines run along the x-axis, with the NAND string connected at bottom to the common source plate.

Multiple NAND strings extend in a vertical direction, i.e. extending in the z-direction, perpendicular to the x-y plane of the substrate. Memory cells are formed where a vertical bit line passes through a word line. A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. The memory holes are then lined with a charge trapping layer and filled with a suitable local bit line/channel material (with suitable dielectric layers for isolation). Similar to planar NAND strings, a top select layer and a bottom select layer containing select gates are located at either end of the vertical NAND string to allow the vertical NAND string to be selectively connected to, or isolated from, external elements. Such external elements are generally conductive lines such as common source lines or bit lines that serve large numbers of NAND strings. Vertical NAND strings may be operated in a similar manner to planar NAND strings and either SLC/MLC/QLC operation is possible.

Figure 6:
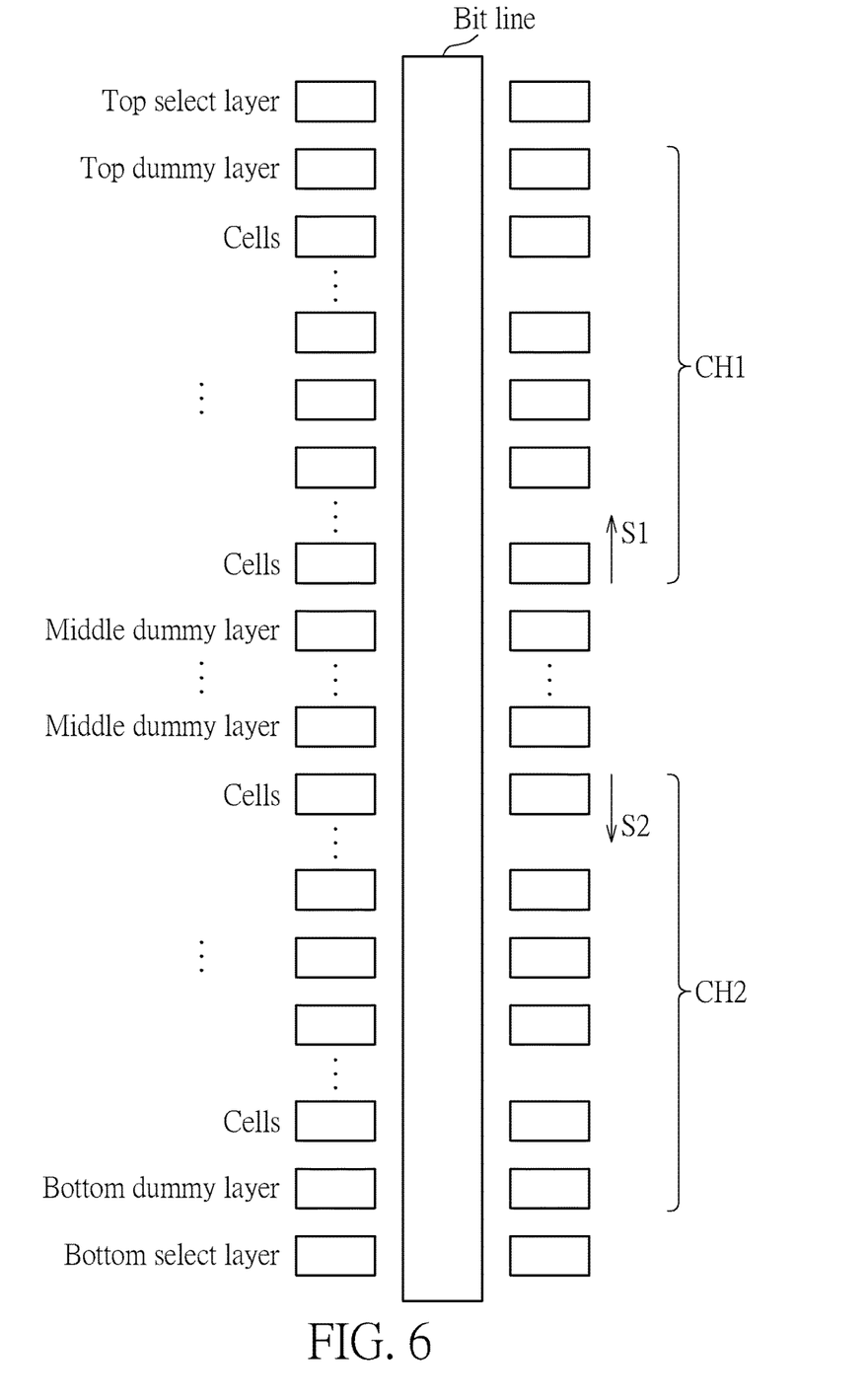
FIG. 6 is a representative diagram illustrating a cross-sectional view of a vertical NAND string in the channel-stacked memory device depicted in FIG. 5 according to an embodiment of the present invention.

FIG. 6 is a representative diagram illustrating a cross-sectional view of a vertical NAND string in the channel-stacked memory device 500 depicted in FIG. 5 according to an embodiment of the present invention. As previously stated, each vertical NAND string may be formed by stacking a plurality of planar NAND strings depicted in FIG. 1. For illustrative purpose, the vertical NAND string depicted in FIG. 6 is formed by stacking two planar NAND strings depicted in FIG. 1, which, when selected, can provide a first group of cells in the first channel CH1 and a second group of cells in the second channel CH2. From top to bottom, the first group of cells in the first channel CH1 is associated with a top dummy layer (the top dummy transistor) and multiple cells (storage transistors), while the second group of cells in the second channel CH2 is associated with multiple cells and a bottom dummy layer (the bottom dummy transistor). One or multiple middle dummy layers are disposed between the first group of cells in the first channel CH1 and the second group of cells in the second channel CH2. The first group of cells in the first channel CH1 and the second channel group of cells in the second channel CH2 are coupled in series and sandwiched between a top select layer (the top select gate) and a bottom select layer (the bottom select gate).

Figure 7:
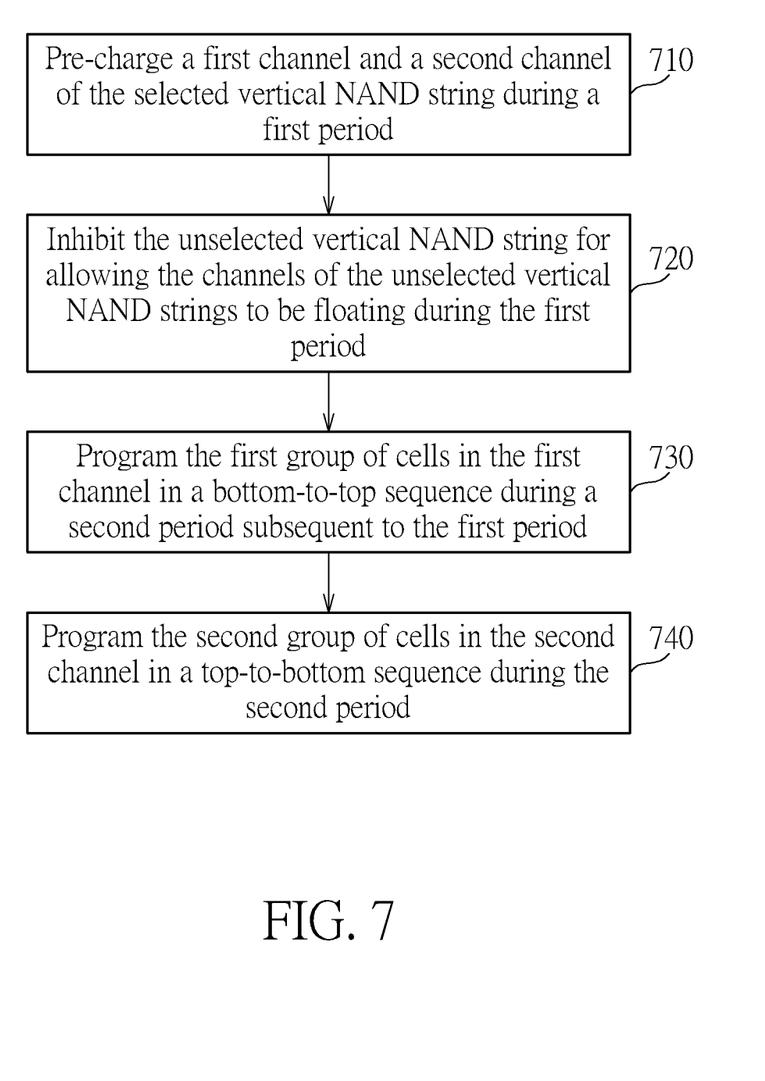
FIG. 7 is a flowchart illustrating a method of programming a channel-stacked memory device according to an embodiment of the present invention.

FIG. 7 is a flowchart illustrating a method of programming the channel-stacked memory device 500 according to an embodiment of the present invention. For illustrative purpose, a selected vertical NAND string and an unselected vertical NAND string in the channel-stacked memory device 500 are addressed. The selected vertical NAND string includes a plurality of cells (selected memory cells) controlled by a selected bit line among the plurality of bit lines $BL_1$-$BL_M$ and the common set of word lines $WL_1$~$WL_N$. Among the plurality of memory cells of the selected NAND string, a cell to be programmed, referred to as a selected cell, is controlled by the selected bit line and a selected word line among the common set of word lines $WL_1$~$WL_N$. Similarly, the unselected vertical NAND string includes a plurality of unselected cells (unselected memory cells) controlled by an unselected bit line among the plurality of bit lines $BL_1$-$BL_M$ and the common set of word lines $WL_1$~$WL_N$. The top dummy layer of each vertical NAND string is laid in the dummy storage area DMX1 and the bottom dummy layer of each vertical NAND string is laid in the dummy storage area DMX2, as depicted in FIGS. 1 and 2. The flowchart in FIG. 7 includes the following steps:

Step 710: pre-charge the first channel CH1 and the second channel CH2 of the selected vertical NAND string during a first period.

Step 720: inhibit the unselected vertical NAND string for allowing the channels of the unselected vertical NAND strings to be floating during the first period.

Step 730: program the first group of cells in the first channel CH1 in a bottom-to-top sequence during a second period subsequent to the first period.

Step 740: program the second group of cells in the second channel CH2 in a top-to-bottom sequence during the second period.

In one embodiment, one or any combination of the control circuitry 20, the read/write circuits 30A and 30B, the row decoders 40A and 40B, the column decoders 50A and 50B, and/or the controller 60 may be referred to as a control unit capable of performing the processes of programming as depicted in FIG. 7.

Figure 8:
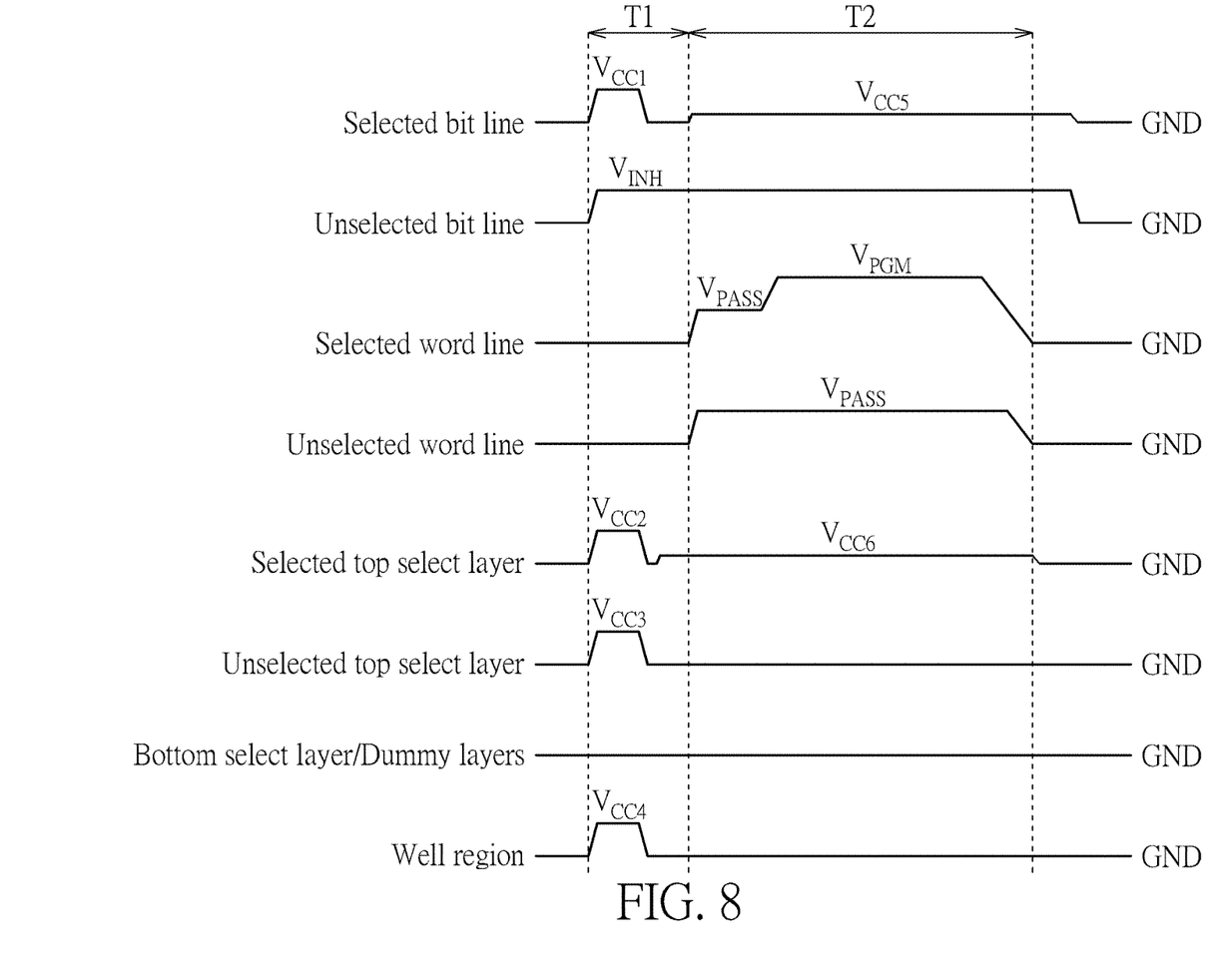
FIG. 8 is a diagram illustrating the levels of related signal lines when executing the method depicted in FIG. 7.

FIG. 8 is a diagram illustrating the levels of related signal lines when executing the method depicted in FIG. 7. The bias condition of related signal lines is summarized in the following Table 1.

TABLE 1

| Period | T1 | T2 |
|---|---|---|
| selected bit line | $V_{CC1}$ | $V_{CC}$ |
| unselected bit line | $V_{INH}$ | $V_{INH}$ |
| selected word line | GND | from $V_{PASS}$ to $V_{PGM}$ |
| unselected word line | GND | $V_{PASS}$ |
| selected top select layer | $V_{CC2}$ | $V_{CC5}$ |
| unselected top select layer | $V_{CC3}$ | GND |
| dummy layers | GND | GND |
| bottom select layer | GND | GND |
| well region | $V_{CC4}$ | GND |

In step 710, the first channel CH1 and the second channel CH2 of the selected vertical NAND string may be pre-charged by respectively applying bias voltages $V_{CC1}$ and $V_{CC2}$ to the selected bit line and the selected top select layer while biasing the selected/unselected word lines, the bottom select layer and the dummy layers at a ground level GND during the first period T1. In an embodiment, $V_{CC1}$=$V_{CC2}$. However, the values of the positive bias voltages $V_{CC1}$ and $V_{CC2}$ do not limit the scope of the invention.

In step 720, the unselected vertical NAND string may be inhibited by applying a positive inhibit voltage $V_{INH}$ to the unselected bit line while biasing the unselected top select layer at a bias voltage $V_{CC3}$ during the first period T1. Under such circumstances, the unselected NAND string may be floating, thereby reducing the program disturb on the selected word line. In an embodiment, $V_{CC2}$=$V_{CC3}$. However, the values of the positive bias voltages $V_{CC2}$ and $V_{CC3}$ do not limit the scope of the invention.

In step 730 or 740, each selected word line may be programed by ramping the selected word line to a pass voltage $V_{PASS}$ and then to a program voltage $V_{PGM}$, biasing the unselected word line at the pass voltage $V_{PASS}$, biasing the selected bit line at a bias voltages $V_{CC5}$, biasing the unselected bit line at the inhibit voltage $V_{INH}$, biasing the selected top select layer at a bias voltages $V_{CC6}$, and biasing the unselected top select layer, the dummy layers, the bottom select layer and the well region at the ground level GND.

In the channel-stacked memory device 500 wherein the first channel CH1 is stacked on the second channel CH2, the first group of cells in the first channel CH1 are programmed in a bottom-to-top sequence and the second group of cells in the second channel CH2 are programmed in a top-to-bottom sequence during the second period T2. More specifically, the first selected cell associated with the first group of cells in the first channel CH1 to be programmed is the cell which is located nearest to the second group of cells in the second channel CH2 than any other cell associated with the first group of cells in the first channel CH1, and the last selected word line associated with the first group of cells in the first channel CH1 to be programmed is the cell which is located farthest from the second group of cells in the second channel CH2 than any other cell associated with the first group of cells in the first channel CH1. Similarly, the first selected cell associated with the second group of cells in the second channel CH2 to be programmed is the cell which is located nearest to the first group of cells in the first channel CH1 than any other cell associated with the second group of cells in the second channel CH2, and the last selected cell associated with the second group of cells in the second channel CH2 to be programmed is the cell which is located farthest from the first group of cells in the first channel CH1 than any other cell associated with the second group of cells in the second channel CH2. Meanwhile, the well region may be biased at the bias voltage $V_{CC4}$ equal to or higher than the ground level during the first period T1.

In the present invention, the channel-stacked memory device 500 may be fabricated by stacking multiple planar NAND memory devices each with its array of memory cells laid in a QLC structure.

In conclusion, in the channel-stacked memory device 500 of the present invention, one or multiple channels located on the upper stack are programmed in a bottom-to-top direction, while one or multiple channels located on the lower stack are programmed in a top-to-bottom direction. This way, the electrons in the channels located on the upper stack may be drained by the bit line, while the electrons in the channels located on the lower stack may be drained by the well region, thereby increasing the boosting voltage of unselected memory strings, as well as allowing a larger margin for the pre-charge voltage of the well region.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of programming a channel-stacked memory device which includes a first channel stacked on a second channel, the method comprising:
   pre-charging the first channel and the second channel during a first period;
   programming a first group of cells in the first channel in a bottom-to-top direction by sequentially programming a $1^{st}$ through an $m^{th}$ cells in the first group of cells during a second period subsequent to the first period; and
   programming a second group of cells in the second channel in a top-to-bottom direction by sequentially programming a $1^{st}$ through an $n^{th}$ cells in the second group of cells during the second period, wherein:
   the first channel is controlled by a selected bit line and a top dummy layer formed on a substrate;
   the second channel is controlled by the selected bit line and a bottom dummy layer formed on the substrate;
   the $1^{st}$ cell in the first group of cells is located nearest to the second channel than any other cells in the first group of cells;
   the $1^{st}$ cell in the second group of cells is located nearest to the first channel than any other cells in the second group of cells; and
   m and n are positive integers larger than 1.

2. The method of claim 1, wherein:
   pre-charging the first channel and the second channel comprises:
      applying a first voltage to the selected bit line during the first period;
      applying a second voltage to a selected top select layer during the first period; and
      biasing a selected storage layer in the first group of cells or the second group of cells, a bottom select layer, the top dummy layer and the bottom dummy layer at a ground level;
   the top dummy layer and the first group of cells are selectively coupled to the selected bit line via the selected top select layer; and
   the bottom dummy layer and the second group of cells are selectively coupled to a source line via the bottom select layer.

3. The method of claim 2, wherein pre-charging the first channel and the second channel further comprises:
   applying a third voltage to a well region of the substrate during the first period.

4. The method of claim 1, further comprising:
   inhibiting an unselected bit line during the first period for allowing channels controlled by the unselected bit line to be floating during the first period.

5. The method of claim 4, wherein inhibiting the unselected bit line comprises:
   applying an inhibit voltage to the unselected bit line during the first period; and
   applying a third voltage to an unselected top select layer during the first period.

6. The method of claim 1, wherein
   programming the first channel or the second channel comprises:
   ramping a selected storage layer in the first group of cells or the second group of cells to a pass voltage and then to a program voltage during the second period, wherein the program voltage is larger than the pass voltage.

7. The method of claim 6, wherein programming the first channel or the second channel further comprises:
   biasing an unselected cell in the first group of cells or the second group of cells at the pass voltage when programming the selected storage layer in the first group of cells or the second group of cells during the second period.

8. The method of claim 1, further comprising:
   programming the $1^{st}$ cell in the first group of cells at a first time point during the second period;
   programming the $m^{th}$ cell in the first group of cells at a second time point during the second period;
   programming the $1^{st}$ cell in the second group of cells at a third time point during the second period; and
   programming the $n^{th}$ cell in the second group of cells at a fourth time point during the second period, wherein the first time point is the same as the third time point.

9. The method of claim 1, further comprising:
   programming the $1^{st}$ cell in the first group of cells at a first time point during the second period;
   programming the $m^{th}$ cell in the first group of cells at a second time point during the second period;
   programming the $1^{st}$ cell in the second group of cells at a third time point during the second period; and programming the $n^{th}$ cell in the second group of cells at a fourth time point during the second period, wherein the third time point occurs after the second time point.

10. The method of claim 1, further comprising:
biasing a middle dummy layer disposed between the first channel and the second channel at a ground level.

11. A memory device, comprising:
a plurality of cells formed on a substrate;
a plurality of bit lines formed on the substrate;
a memory string comprising:
   a first channel having a first group of cells and controlled by a selected bit line among the plurality of bit lines and a top dummy layer formed on the substrate;
   a second channel having a second group of cells and controlled by the selected bit line and a bottom dummy layer formed in the substrate, wherein the first channel is stacked on the second channel; and
a control unit configured to:
   pre-charge the first channel and the second channel during a first period;
   program the first group of cells in the first channel in a bottom-to-top direction by sequentially programming a $1^{st}$ through an $m^{th}$ cell in the first group of cells during a second period subsequent to the first period; and
   program the second group of cells in the second channel in a top-to-bottom direction by sequentially programming a $1^{st}$ through an $n^{th}$ cell in the second group of cells during the second period, wherein:
      the $1^{st}$ cell in the first group of cells is located nearest to the second channel than any other cell in the first group of cells;
      the $1^{st}$ cell in the second group of cells is located nearest to the first channel than any other cell in the second group of cells; and
      m and n are positive integers larger than 1.

12. The memory device of claim 11, further comprising:
a selected top select layer which selectively couples the top dummy layer and the first group of cells to the selected bit line; and
a bottom select layer which selectively couples the bottom dummy layer and the second group of cells to a source line.

13. The memory device of claim 12, wherein the control unit is further configured to pre-charge the first channel and the second channel by:
   applying a first voltage to the selected bit line during the first period;
   applying a second voltage to the selected top select layer during the first period; and
   biasing a selected cell in the first group of cells or the second group of cells, the bottom select layer, the top dummy layer and the bottom dummy layer at a ground level.

14. The memory device of claim 11, wherein the control unit is further configured to inhibit an unselected bit line among the plurality of bit lines during the first period for allowing channels associated with the unselected bit line to be floating during the first period.

15. The memory device of claim 14, wherein the control unit is further configured to inhibit the unselected bit line during the first period by:
   applying a first voltage to the selected bit line during the first period;
   applying a second voltage to the selected top select layer during the first period; and
   biasing a selected cell in the first group of cells or the second group of cells, the bottom select layer, the top dummy layer and the bottom dummy layer at a ground level.

16. The memory device of claim 11, wherein the control unit is further configured to program the first channel or the second channel by:
   ramping a selected cell in the first group of cells or the second group of cells to a pass voltage and then to a program voltage during the second period, wherein the program voltage is larger than the pass voltage.

17. The memory device of claim 16, wherein the control unit is further configured to program the first channel or the second channel by:
   biasing an unselected cell in the first group of cells or the second group of cells at the pass voltage when programming the selected cell in the first group of cells or the second group of cells during the second period.

18. The memory device of claim 16, further comprising a middle dummy layer disposed between the first channel and the second channel, wherein the control unit is further configured to bias the middle dummy layer at a ground level.

* * * * *